US009490325B2

(12) United States Patent
Weeks (10) Patent No.: US 9,490,325 B2
(45) Date of Patent: Nov. 8, 2016

(54) STRUCTURES AND DEVICES INCLUDING A TENSILE-STRESSED SILICON ARSENIC LAYER AND METHODS OF FORMING SAME

(71) Applicant: ASM IP Holding B.V., Almere (NL)

(72) Inventor: Keith Doran Weeks, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/055,122

(22) Filed: Feb. 26, 2016

(65) Prior Publication Data
US 2016/0181368 A1    Jun. 23, 2016

Related U.S. Application Data

(62) Division of application No. 14/018,345, filed on Sep. 4, 2013, now Pat. No. 9,324,811.

(51) Int. Cl.
| H01L 21/02 | (2006.01) |
| H01L 29/10 | (2006.01) |
| H01L 29/267 | (2006.01) |
| H01L 29/78 | (2006.01) |
| H01L 21/67 | (2006.01) |

(52) U.S. Cl.
CPC ....... *H01L 29/1054* (2013.01); *H01L 21/0262* (2013.01); *H01L 21/02521* (2013.01); *H01L 21/02532* (2013.01); *H01L 21/02576* (2013.01); *H01L 29/267* (2013.01); *H01L 29/7851* (2013.01); *H01L 21/67207* (2013.01)

(58) Field of Classification Search
CPC ............. H01L 29/1054; H01L 29/267; H01L 29/7851; H01L 21/02521; H01L 21/02576; H01L 21/0262; H01L 21/67207
See application file for complete search history.

(56) References Cited

U.S. PATENT DOCUMENTS

2008/0182075 A1* 7/2008 Chopra ........... H01L 21/823807
   428/172
2013/0011983 A1* 1/2013 Tsai ................ H01L 21/823807
   438/285

* cited by examiner

*Primary Examiner* — Yosef Gebreyesus
(74) *Attorney, Agent, or Firm* — Snell & Wilmer LLP (57) ABSTRACT

Structures including a tensile-stressed silicon arsenic layer, devices including the structures, and methods of forming the devices and structures are disclosed. Exemplary tensile-stressed silicon arsenic layer have an arsenic doping level of greater than 5 E+20 arsenic atoms per cubic centimeter. The structures can be used to form metal oxide semiconductor devices.

20 Claims, 9 Drawing Sheets

STRUCTURES AND DEVICES INCLUDING A TENSILE-STRESSED SILICON ARSENIC LAYER AND METHODS OF FORMING SAME

CROSS REFERENCE TO RELATED APPLICATION

This application is a division of and claims priority to U.S. application Ser. No. 14/018,345 entitled "STRUCTURES AND DEVICES INCLUDING A TENSILE-STRESSED SILICON ARSENIC LAYER AND METHODS OF FORMING SAME," filed on Sep. 4, 2013, which claims the benefit and priority of Provisional Application No. 61/705,932, filed on Sep. 26, 2012, entitled TENSILE STRESSED SILICON-ARSENIC ALLOYS, the contents of which are hereby incorporated by reference to the extent the contents do not conflict with the present disclosure.

FIELD OF INVENTION

The present disclosure generally relates to semiconductor structures and devices and to methods of forming the structures and devices. More particularly, the disclosure relates to structures and devices that include a silicon arsenic layer and to methods of forming the structures and devices.

BACKGROUND OF THE DISCLOSURE

Semiconductor devices may include a tensile-stressed layer for a variety of reasons. For example, metal oxide semiconductor (MOS) devices may include a tensile-stressed layer, which forms part of a channel region of the devices. The tensile-stressed layer may exhibit higher carrier mobility—compared to a similar, non-stressed layer. As a result, devices formed with, for example, a tensile-stressed channel layer or region may exhibit faster switching speeds, better performance, and/or lower power consumption.

Many semiconductor devices use silicon as a semiconducting material for a channel region within MOS devices. In these cases, a tensile stress in the silicon (e.g., a silicon layer) may be created by doping a silicon layer with carbon atoms, which are smaller and have a smaller lattice constant than silicon atoms. Because the carbon atoms are smaller than silicon atoms, when the carbon atoms form part of the substantially silicon crystal lattice, the crystal lattice becomes tensile stressed.

Although doping silicon with carbon can create a tensile stress within a silicon lattice, adding carbon to the silicon lattice may reduce mobility of a carrier within the lattice structure (e.g., a channel region of a device). To compensate for the lower carrier mobility, the silicon may be doped with additional material, such as n-type dopants (e.g., phosphorous, arsenic, or antimony). While, this approach may provide a tensile-stressed silicon region, use of carbon doping may require additional processing steps, materials, and equipment to form a suitable tensile-stressed region or layer having desired carrier mobility. Accordingly, improved methods of forming tensile-stressed silicon regions or layers and structures and devices including the regions or layers are desired.

SUMMARY OF THE DISCLOSURE

Various embodiments of the present disclosure relate to structures and devices including a tensile-stressed silicon region or layer and to methods of forming the structures and devices. While the ways in which various embodiments of the disclosure address the drawbacks of the prior art structures, devices, and methods are discussed in more detail below, in general, the present disclosure provides methods of forming a tensile-stressed silicon layer using an n-type silicon dopant, arsenic, and structures and devices including arsenic-doped silicon tensile-stress layers or regions. As set forth in greater detail below, because arsenic acts as an electron donor, desired tensile stress within a silicon layer or region may be obtained without requiring additional processing and/or equipment, as may be used or required when, for example, carbon is used to create a tensile stress in a silicon layer or region.

In accordance with exemplary embodiments of the disclosure, a structure, also referred to herein as a film stack, includes a silicon layer (e.g., part of a substrate) and a tensile-stressed silicon arsenic layer (e.g., a silicon arsenic alloy) adjacent the silicon layer, wherein a concentration of arsenic in the silicon arsenic layer is greater than 5E+20 arsenic atoms per cubic centimeter. In accordance with various aspects of these embodiments, the concentration of arsenic in the layer ranges from greater than 5E+20 to about 1E+22 or more. In accordance with further aspects, the concentration of arsenic in the layer is greater than or equal to 1E+21, greater than or equal to 5E+21 arsenic atoms per cubic centimeter, or greater than or equal to about 1E+22 arsenic atoms per cubic centimeter. The relatively high level of arsenic doping may provide enough stress in the tensile-stressed silicon arsenic layer, such that additional dopants, such as carbon are not required to obtain a desired amount of stress in the layer to, for example, obtain desired device properties. In accordance with further aspects, the tensile-stressed silicon arsenic layer is epitaxially grown, using, for example, chemical vapor deposition (CVD) techniques, such as low pressure CVD (LPCVD), ultra-high vacuum CVD (UHV-CVD), or remote plasma CVD (RPCVD). In accordance with further aspects, the structure may include a plurality of tensile-stressed silicon arsenic layers. Structures in accordance with these embodiments can be used to form metal oxide semiconductor (MOS) devices, such as n-channel MOS (NMOS) and complimentary MOS (CMOS) devices, or for a diffusion layer, such as, for example for use in the manufacture of a finFET device.

In accordance with additional embodiments of the disclosure, a method of forming a tensile-stressed silicon arsenic layer includes the steps of supporting a substrate comprising silicon in a reactor, wherein a surface of the substrate is exposed to a reaction region within the reactor, supplying a silicon source to the reactor, supplying an arsenic source to the reactor, and forming the tensile-stressed silicon arsenic layer having a concentration of arsenic of greater than 5 E+20 arsenic atoms/cubic centimeter on the surface. In accordance with various aspects of these embodiments, a temperature of the reaction region is between about 350° C. and 700° C., about 450° C. and 700° C., or about 500° C. and 700° C. In accordance with further aspects, a pressure within the reaction region is between about 1 and about 760 Torr, or about 90 to about 300 Torr. Although mentioned as separate steps, the steps of supplying a silicon source to the reactor and supplying an arsenic source to the reactor may be performed simultaneously. In accordance with some exemplary aspects of these embodiments, during the step of supplying an arsenic source to the reactor, an arsenic source (e.g., arsine) is provided in a diluent, which may be reactive (e.g., hydrogen) or non-reactive (e.g., nitrogen, argon, helium, or the like). In accordance with yet further exemplary aspects, the tensile-stressed silicon arsenic layer is epitaxially formed overlying the surface—e.g., using chemical vapor deposition (CVD) techniques. In accordance with yet further aspects of these embodiments, the concentration of arsenic in the layer ranges from greater than 5E+20 to about 1E+22 or more. In accordance with further aspects, the concentration of arsenic in the layer is greater than or equal to 1E+21, greater than or equal to 5E+21 arsenic atoms per cubic centimeter, or greater than or equal to about 1E+22 arsenic atoms per cubic centimeter. Methods in accordance with these embodiments can be used to form structures and devices, such as the structures and devices described herein.

In accordance with additional embodiments of the disclosure, a semiconductor device, such as a MOS, NMOS, or CMOS device, includes a silicon layer and a tensile-stressed silicon arsenic layer adjacent the silicon layer. In accordance with various aspects of these embodiments, the device includes a channel including a tensile-stressed silicon arsenic region formed on the silicon layer, the tensile-stressed silicon arsenic region having a concentration of arsenic of greater than 5 E+20 arsenic atoms/cubic centimeter, a source and a drain separated from one another by the channel, and a gate configured to control current flow through the channel. The gate may suitably include a dielectric layer between the channel region and a gate electrode. In accordance with various aspects of these embodiments, the concentration of arsenic in the layer ranges from greater than 5E+20 to about 1E+22 or more. In accordance with further aspects, the concentration of arsenic in the layer is greater than or equal to 1E+21, greater than or equal to 5E+21 arsenic atoms per cubic centimeter, or greater than or equal to about 1E+22 arsenic atoms per cubic centimeter. In accordance with further aspects, the tensile-stressed silicon arsenic layer is epitaxially grown, using, for example, chemical vapor deposition (CVD) techniques. In accordance with further aspects, the structure may include a plurality of tensile-stressed silicon arsenic layers.

Both the foregoing summary and the following detailed description are exemplary and explanatory only and are not restrictive of the disclosure or the claimed invention.

BRIEF DESCRIPTION OF THE DRAWING FIGURES

A more complete understanding of the embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE DISCLOSURE

The description of exemplary embodiments of methods, structures, and devices provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure generally relates to structures and devices that include a tensile-stressed silicon layer and to methods of forming the structures and devices. As used herein, a tensile stress refers to a stress imparted to a first material having a smaller lattice spacing relative to a lattice spacing of a second material to which the first material is bound/adhered. Because the atoms of the first material are held at a greater distance from one another by spacing of atoms in the second material than the lattice spacing of the first material, atoms in the first material experience a tensile force, e.g., a force that would tend to draw the atoms in the first material further away from one another. Without wishing to be bound by theory, inducing stress in a lattice structure may alter interatomic forces. As set forth in more detail below, when tensile-stressed materials are used in semiconductor devices (e.g., channel regions within a metal oxide semiconductor (MOS) device), carrier transport through the tensile-stressed material may be increased. For example, pulling the lattice farther apart, as in a tensile-stressed film, may ease passage of carriers through the lattice. In turn, device power consumption and switching speed may be enhanced relative to similar devices that do not include such tensile-stressed material.

Figure 10:
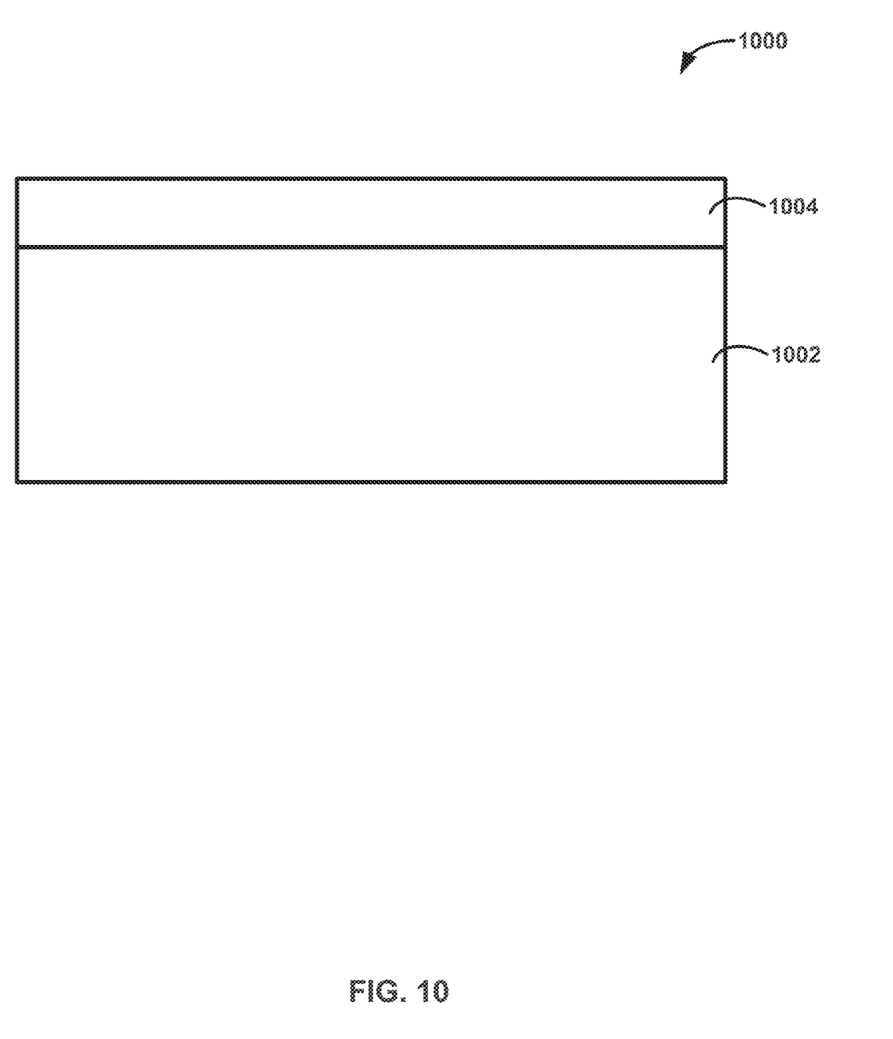
FIG. 10 illustrates a structure including a tensile-stressed silicon arsenic layer in accordance with various embodiments of the disclosure.

FIG. 10 illustrates a structure 1000, which includes a silicon layer 1002 (e.g., a portion of a substrate) and a tensile-stressed layer 1004. As used herein, a "substrate" refers to any material having a surface onto which material can be deposited. A substrate may include a bulk material such as silicon (e.g., single crystal silicon which may include dopants) or may include one or more layers overlying the bulk material. Further, the substrate may include various topologies, such as trenches, vias, lines, and the like formed within or on at least a portion of a layer of the substrate. Tensile-stressed layer 1004, in accordance with various embodiments of the disclosure, includes a silicon film or region that is doped with arsenic at a concentration of greater than 5 E+20 arsenic atoms/cubic centimeter, within an acceptable tolerance. In accordance with various aspects of these embodiments, the concentration of arsenic in the layer ranges from greater than 5E+20 to about 1E+22 or more. In accordance with further aspects, the concentration of arsenic in the layer is greater than or equal to 1E+21, greater than or equal to 5E+21 arsenic atoms per cubic centimeter, or greater than or equal to about 1E+22 arsenic atoms per cubic centimeter.

As set forth in more detail below, layer 1004 may be formed by forming an arsenic-doped silicon film by a suitable chemical vapor deposition (CVD) process, such as an epitaxial CVD process where suitable silicon and arsenic sources react to form a silicon arsenic alloy. Such films may be used for mobility enhancement in MOS devices, such as NMOS and CMOS devices—without including carbon dopants. Eliminating carbon dopants may potentially improve electrical performance and may reduce device processing time, and equipment and materials used to form devices. Layer 1004 may alternatively be used as a solid-source dopant—e.g., for formation of multigate devices, such as FinFETs.

Figure 1:
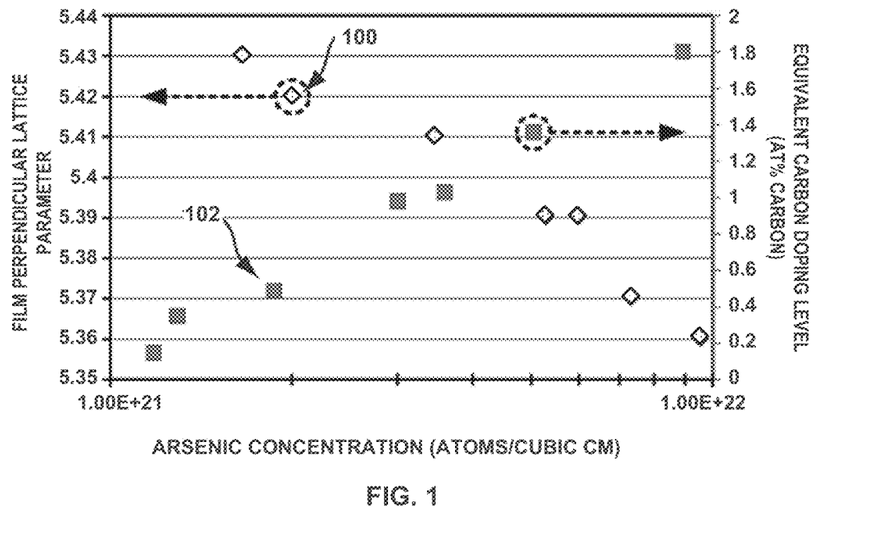
FIG. 1 illustrates a relationship between arsenic concentration and perpendicular lattice parameter, and a relationship between arsenic concentration and equivalent carbon doping level for examples of silicon arsenic alloys formed according to exemplary embodiments of the present disclosure.

FIG. 1 illustrates a relationship 100 between a perpendicular lattice parameter for examples of silicon arsenic alloys (e.g., layer 1004) formed according to various embodiments of the present disclosure and arsenic concentration for those films. As used herein, the term "alloy" means a crystalline material, wherein at least some of the lattice sites of a crystalline material are substituted with atoms from a dopant. In the case of silicon arsenic alloys, at least some arsenic atoms reside on silicon crystal lattice sites.

The data illustrated in FIG. 1 were obtained using X-ray diffraction (XRD) and secondary ion mass spectrometry (SIMS). As shown in relationship 100, as arsenic levels increase in the silicon films, the perpendicular lattice parameter becomes smaller. For example, at an arsenic concentration of approximately 1.65 E+21 arsenic atoms/cubic centimeter (approximately 3.3 atomic percent arsenic), the perpendicular lattice parameter for the silicon arsenic alloy is approximately 5.42 Å. At an arsenic concentration of approximately 9.56 E+21 arsenic atoms/cubic centimeter (approximately 19.12 atomic percent arsenic), the perpendicular lattice parameter for the silicon arsenic alloy is approximately 5.36 Å, so that the atoms are spaced 0.06 Å closer together. This decreasing trend in lattice spacing, combined with x-ray diffraction data presented herein, indicates that the silicon arsenic alloy (e.g., layer 1004) exhibits a tensile stress when present on a silicon substrate (e.g., substrate 1002) with a wider lattice parameter.

FIG. 1 also illustrates a relationship 102 between arsenic concentration and equivalent carbon doping level for exemplary silicon arsenic alloys. In other words, relationship 102 correlates arsenic concentration in the silicon arsenic alloy with an amount of carbon effective to create an equivalent tensile stress in a carbon-doped silicon film. Thus, it will be appreciated that the effective atomic percentage of carbon described herein is believed to be a proxy for an amount of arsenic that is effective to generate an equivalent film of approximately equal tensile stress.

Figure 2:
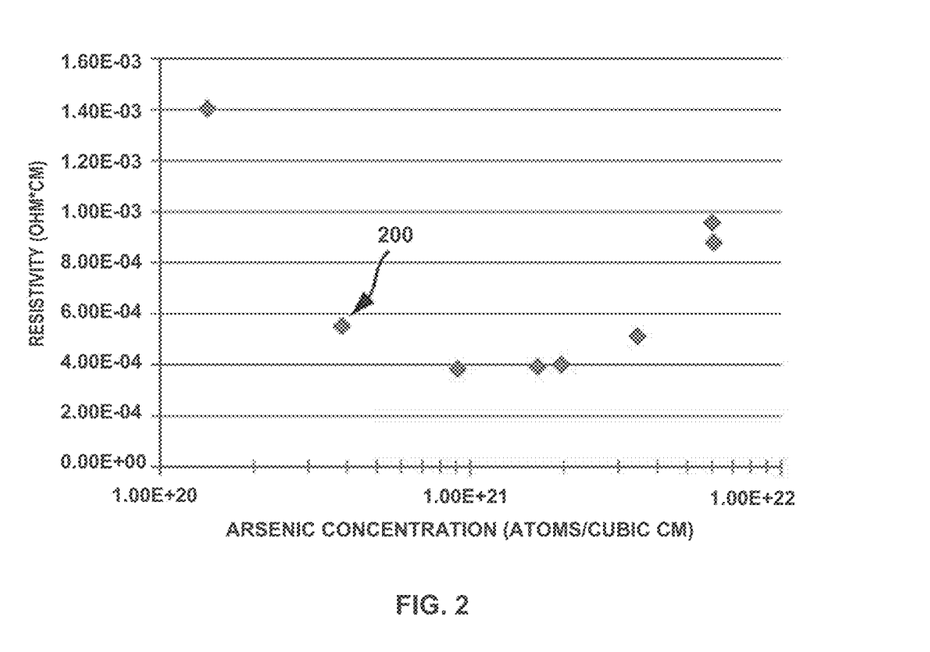
FIG. 2 illustrates a relationship between arsenic concentration and film resistivity for examples of silicon arsenic alloys formed according to exemplary embodiments of the present disclosure.

FIG. 2 illustrates a relationship 200 between arsenic concentration and film resistivity for examples of silicon arsenic alloys formed according to embodiments of the present disclosure. Initially, relationship 200 illustrates a decreasing correspondence between the arsenic concentration and the resistivity (e.g., the resistivity drops to approximately 4 E−04 Ohm*cm at an arsenic concentration of approximately 9 E+20 arsenic atoms/cubic cm).

Relationship 200 further illustrates that increasing the arsenic concentration beyond approximately 9 E+20 arsenic atoms/cubic cm causes the resistivity to increase. In some embodiments, this increase may begin at approximately 2-3 E+21 arsenic atoms/cubic cm. Without wishing to be bound by theory, this increase in resistivity may be attributable to such causes as alloy scattering and/or degradation of the crystal lattice. Though not illustrated in FIG. 2, a minimum resistivity may be reached at approximately 4 E+20 arsenic atoms/cubic cm. Further, though also not shown in FIG. 2, increasing the concentration of arsenic within the film may eventually cause the resistivity of the film to stabilize at approximately 0.3 mOhm*cm. It will be understood that deposition conditions may have an impact on resistivity, thereby allowing processes to be optimized for film performance; for example, decreasing process temperature generally decreases the resistivity of the film. This is described in more detail below with reference to FIG. 7.

Figure 3:
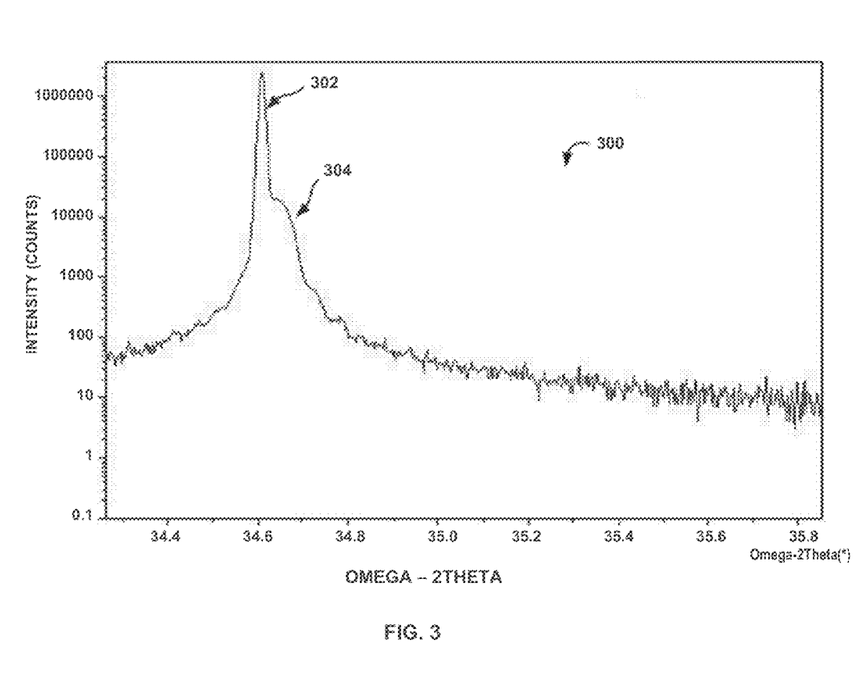
FIG. 3 illustrates an example X-ray diffraction spectrum for a silicon arsenic alloy formed according to an exemplary embodiment of the present disclosure.

FIG. 3 illustrates an example XRD spectrum 300 for a silicon arsenic alloy formed according to an embodiment of the present disclosure. The alloy shown in FIG. 3 includes approximately 1.25 E+21 arsenic atoms/cubic centimeter as measured by Rutherford backscattering spectrometry (RBS), or approximately 2.5 atomic percent arsenic. This level of arsenic doping is believed to exhibit the same level of tensile stress as a silicon film including approximately 0.15 atomic percent carbon. Spectrum 300 includes a peak 302 at approximately 34.6 omega-2θ believed to be associated with the silicon substrate and a shoulder peak 304 at 34.7 omega-2θ believed to be associated with the silicon arsenic alloy and to indicate tensile strain. Thus, it is believed that the arsenic can be doped into the silicon film at a level that is suitable to generate a detectable silicon arsenic alloy.

As noted above, in accordance with exemplary embodiments of the disclosure, the silicon arsenic alloys described herein may be formed using chemical vapor deposition (CVD) techniques, such as low pressure CVD (LPCVD), ultra-high vacuum CVD (UHV-CVD), or remote plasma CDV (RPCVD). In accordance with various aspects of these embodiments, a silicon arsenic alloy may be formed by epitaxially depositing the silicon arsenic alloy on a suitable substrate (e.g., a silicon layer), so that a crystalline film of silicon arsenic alloy is formed over a crystalline substrate. Epitaxially forming the alloy over a suitable substrate may provide desirable lattice registration between the alloy and the substrate, so that a tensile stress is imparted by a mismatch in lattice parameters. However, it will be appreciated that any suitable method of forming a silicon arsenic alloy having a tensile stress on a suitable substrate may be employed without departing from the scope of the present disclosure.

Figure 4:
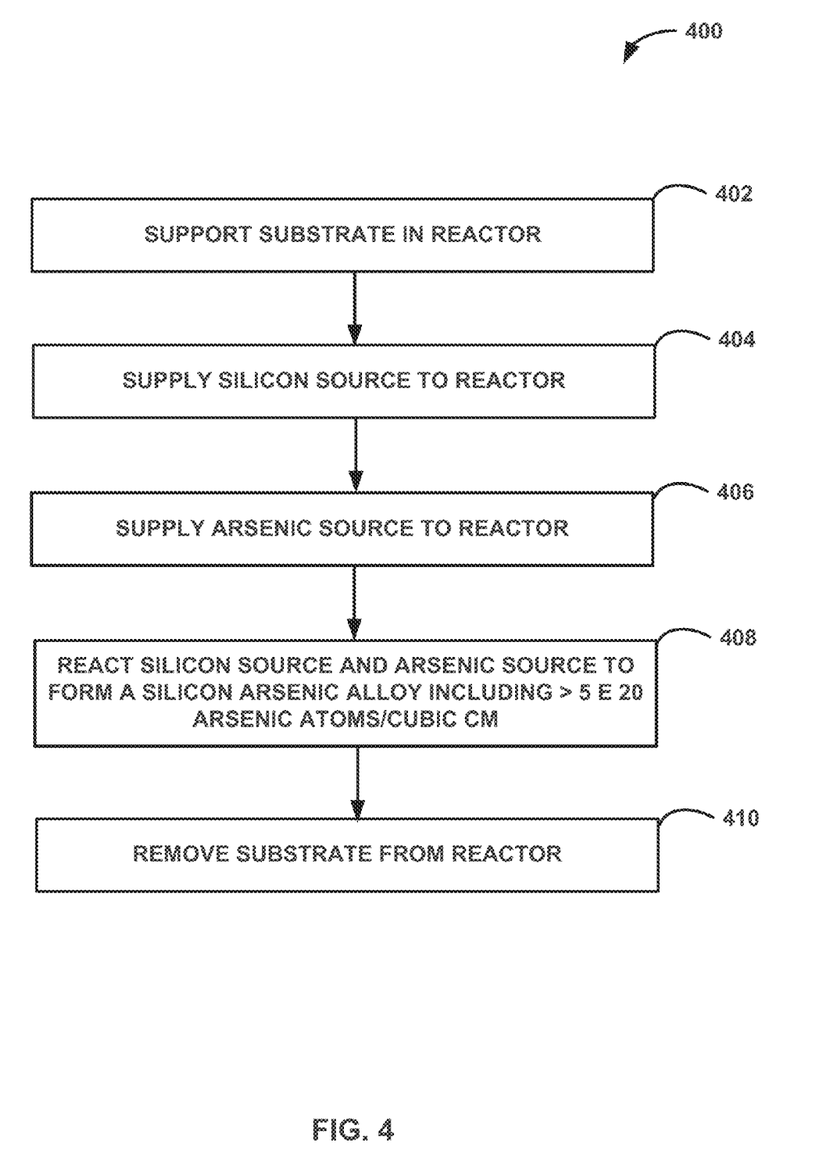
FIG. 4 illustrates a flow chart illustrating a method of forming a silicon arsenic alloy according to an exemplary embodiment of the present disclosure.

FIG. 4 illustrates a flow chart illustrating a method 400 for epitaxially depositing or forming a silicon arsenic alloy on a silicon substrate in accordance with exemplary embodiments of the disclosure. It will be appreciated that the processes illustrated in FIG. 4 and described below are provided for discussion purposes and that some processes may be omitted, re-ordered, performed simultaneously, or substituted without departing from the scope of the present disclosure.

At 402, method 400 includes supporting a substrate in a reactor. For example, the substrate may be supported so that a silicon surface, on which the silicon arsenic alloy will be formed, is exposed to a reaction region within the reactor where one or more film formation reactions may occur. In some embodiments, supporting the substrate in the reactor may include adjusting one or more reactor conditions, such as temperature, pressure, and/or carrier gas (e.g., Ar, $N_2$, $H_2$, or He) flow rate, to conditions suitable for film formation. For example, in some embodiments, a reactor temperature may be adjusted so that a reaction region formed near an exposed silicon surface of the substrate, or that the surface of the substrate itself, is within a range of 500° C.-700° C., or about 350° C.-700° C., or about 450° C.-700° C. and that the reaction region pressure is within range of about 1 to about 760 Torr or 90-300 Torr. Further, in some embodiments, carrier (e.g., nitrogen) gas may be supplied at a flow rate of approximately 10 to 40 standard liters/minute (SLM). However, it will be appreciated that in some embodiments, a different carrier/diluent gas may be employed, a different flow rate may be used, or that such gas(es) may be omitted.

At 404, method 400 includes supplying a silicon source to the reactor. Non-limiting examples of suitable silicon sources include silane ($SiH_4$), dichlorosilane ($SiH_2Cl_2$), trisilane ($Si_3H_8$), and disilane ($Si_2H_6$). A flowrate of a silicon source may vary according to the precursor sources used. For example, in some embodiments, trisilane may be supplied at between 110 and 220 mg/minute. Dichlorosilane may be supplied at, for example, between 100 and 400 sccm.

At 406, method 400 includes supplying an arsenic source to the reactor. One non-limiting example of an arsenic source includes arsine ($AsH_3$) diluted in a carrier, such as $H_2$—e.g., a one percent arsine in hydrogen source. For example, arsine may be supplied at between 10 and 2500 sccm with 20.7 slm hydrogen. A non-reactive diluent gas (e.g., nitrogen) and/or a reactive diluent gas (e.g., hydrogen) may be used to supply the arsenic source to the reactor. A non-reactive diluent gas may exhibit comparatively less substrate surface site occupation relative to reactive diluent gases. In other words, a non-reactive diluent gas may be selected in view of transport equilibrium relationships in the reaction system. However, it will be appreciated that one or more reactive diluent gases may be selected/provided in view of other reaction equilibrium relationships in the reaction system, so that concentration of arsenic active species may be managed during the film formation.

Although illustrated as separate steps, steps 404 and 406 may occur simultaneously, substantially simultaneously, and/or in reverse order.

At 408, method 400 includes reacting the silicon source and the arsenic source to form a tensile-stressed silicon arsenic alloy having an arsenic concentration of greater than 5 E+20 arsenic atoms/cubic centimeter, within an acceptable tolerance. In accordance with various aspects of these embodiments, the concentration of arsenic in the layer ranges from greater than 5E+20 to about 1E+22 or more. In accordance with further aspects, the concentration of arsenic in the layer is greater than or equal to 1E+21, greater than or equal to 5E+21 arsenic atoms per cubic centimeter, or greater than or equal to about 1E+22 arsenic atoms per cubic centimeter. For example, the silicon source and the arsenic source may react in a reaction region of the reactor so that the silicon arsenic alloy is epitaxially formed on a silicon surface of the substrate. Various reactions related to film formation may occur in the gas phase and/or on the surface. Suitable silicon active species and arsenic active species may react directly and/or via suitable intermediates to form the silicon arsenic alloy film. In some embodiments, tensile-stressed silicon arsenic films may be formed having 1.0 E+21 arsenic atoms/cubic centimeter. In some embodiments, tensile-stressed silicon arsenic films may be formed having 1.0 E+22 arsenic atoms/cubic centimeter.

Reactor conditions during steps 404-408 may be the same or similar to those described above in connection with step 402. At 410, method 400 includes removing the substrate bearing the silicon arsenic alloy film from the reactor.

Figure 5:
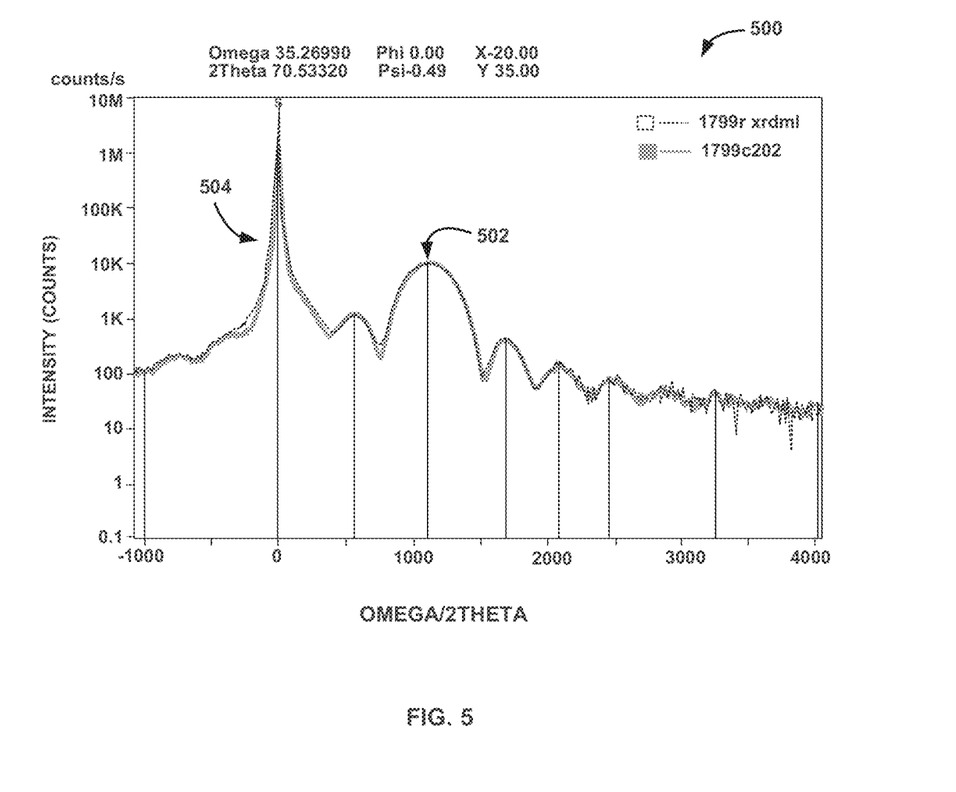
FIG. 5 illustrates an example X-ray diffraction spectrum for an exemplary silicon arsenic alloy formed on a silicon substrate according to an exemplary embodiment of the present disclosure.

Method 400 may be used to form a suitable silicon arsenic alloy on any suitable substrate so as to form an alloy having a tensile stress. FIG. 5 illustrates an XRD spectrum 500 for an exemplary silicon arsenic alloy formed according to an exemplary aspect of method 400. As shown in spectrum 500, the silicon arsenic alloy, shown at peak 502, is formed on top of a silicon substrate, shown at peak 504. The silicon arsenic alloy layer data shown in FIG. 5 was formed at 500° C. and 300 Torr using 220 mg/min of trisilane and 1500 sccm of arsine (1% arsine in hydrogen). The alloy depicted in FIG. 5 has an arsenic concentration of approximately 4.3 E+21 arsenic atoms/cubic centimeter, which is believed to be approximately equivalent to a tensile-stressed silicon film including about 1.01 atomic percent carbon. Tensile strain is evidenced by the silicon arsenic layer peak. It will be noted that the concentration of arsenic in the sample of FIG. 5 is higher than that of FIG. 3, and that the silicon arsenic layer peak of FIG. 5 is more clearly separated from the silicon substrate peak than that of FIG. 3, indicating the smaller lattice parameter for the sample with the higher arsenic concentration.

Figure 6:
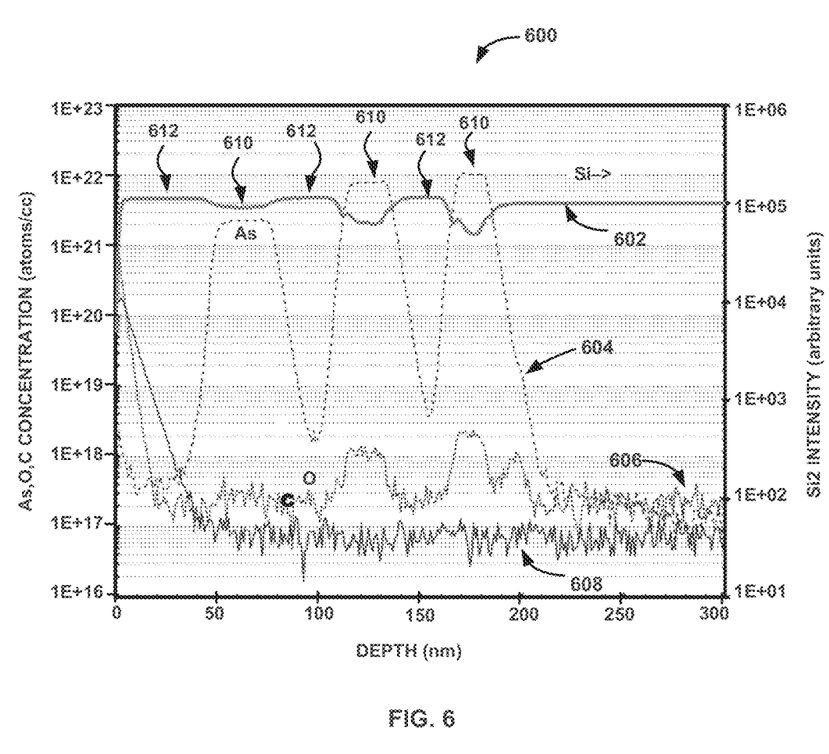
FIG. 6 illustrates a secondary ion mass spectrometry depth profile for a film stack or structure including a plurality of silicon arsenic alloy layers and a plurality of silicon layers formed according to an exemplary embodiment of the present disclosure.

In accordance with various aspects of exemplary embodiments, method 400 may be managed to deposit a plurality of silicon arsenic layers. For example, FIG. 6 illustrates a SIMS depth profile 600 illustrating an embodiment of a film stack. Depth profile 600 includes a silicon spectrum 602, an arsenic spectrum 604, an oxygen spectrum 606, and a carbon spectrum 608. Depth profile 600 illustrates three discrete silicon arsenic alloy layers, shown as layers 610, which are separated from one another and capped by silicon films, shown as layers 612. Thus, it will be appreciated that sandwich structures of silicon arsenic alloys and silicon films or any other suitable intervening film may be formed in a suitable reactor system (e.g., in-situ, without exposure to air and/or a vacuum break). If employed, such in-situ deposition techniques may avoid the formation of adventitious oxides that may alter device electrical properties.

As mentioned above, various reaction conditions may be altered to adjust properties of the silicon arsenic alloy. Such conditions may be adjusted at any suitable time before, during, or after film deposition. For example, reactor conditions may be adjusted before film deposition to prepare the substrate surface and/or reaction environment for deposition. Reactor conditions may be adjusted during film deposition to adjust one or more film properties (e.g., to alter film concentration, etc.). Reactor conditions may be adjusted after film deposition to post-treat a deposited film and/or to prepare for deposition of a subsequent layer.

Figure 7:
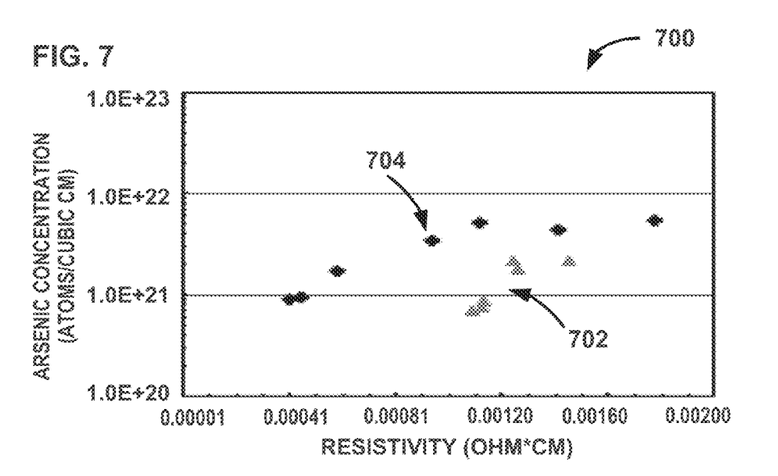
FIG. 7 illustrates a relationship between resistivity and arsenic concentration for silicon arsenic alloys formed at different temperatures according to exemplary embodiments of the present disclosure.

For example, reactor temperature may be varied to alter the resistivity of the deposited silicon arsenic alloy. FIG. 7 illustrates a comparison 700 between concentration/resistivity relationships for embodiments of silicon arsenic alloys formed at different temperatures using different silicon sources. For example, family 702 (triangles) illustrates concentration/resistivity relationships for alloys formed using trisilane at 500° C. In contrast, family 704 (diamonds) illustrates concentration/resistivity relationships for alloys formed using dichlorosilane at 700° C. Without wishing to be bound by theory, reducing the film formation temperature may help incorporate arsenic within the silicon lattice. It is believed that increased arsenic incorporation may help increase arsenic concentration within the alloy and increase tensile film stress.

Figure 8:
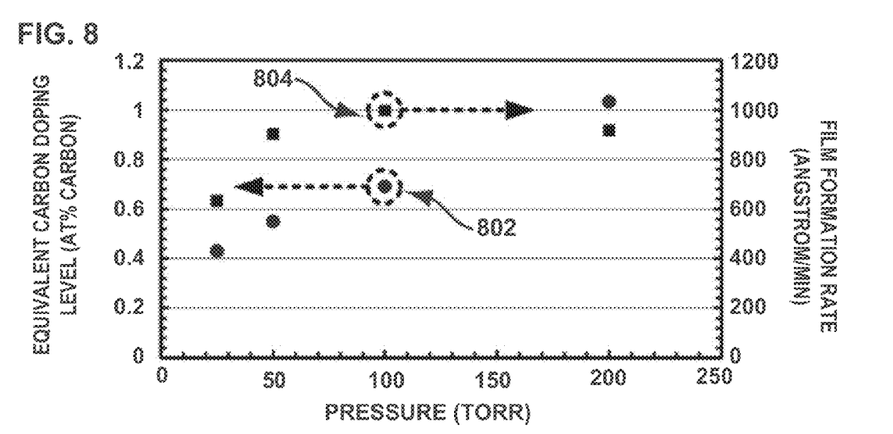
FIG. 8 illustrates a relationship between processing pressure and equivalent carbon doping level and a relationship between processing pressure and film formation rate for exemplary silicon arsenic alloys formed according to exemplary embodiments of the present disclosure.

As another example, reactor pressure may be varied to alter the stress of the deposited film and/or to vary the growth rate of the deposited film. FIG. 8 illustrates a relationship 802 (circles) between reactor pressure and equivalent carbon doping level for embodiments of silicon arsenic alloys. The films shown in FIG. 8 were deposited at the same temperature, silicon source supply conditions, and arsenic source supply conditions. As shown in relationship 802, an increase in the reactor pressure corresponds to an increase in the equivalent carbon doping level, which is believed to correspond to an increase in tensile film stress.

Relationship 804 (squares), shown in FIG. 8, correlates what is believed to be a saturating relationship between reactor pressure and film deposition rate. This may indicate a transition from a kinetically-dominated reaction regime at pressures below 100 Torr to a mass transfer-dominated reaction regime at pressures in excess of 100 Torr. Without wishing to be bound by theory, it may be that a pressure-dependent mechanism for incorporating arsenic within the lattice operates at least partially independently from the bulk film formation chemistry in some conditions based upon the apparent mechanistic differences shown in relationships 802 and 804.

Figure 9:
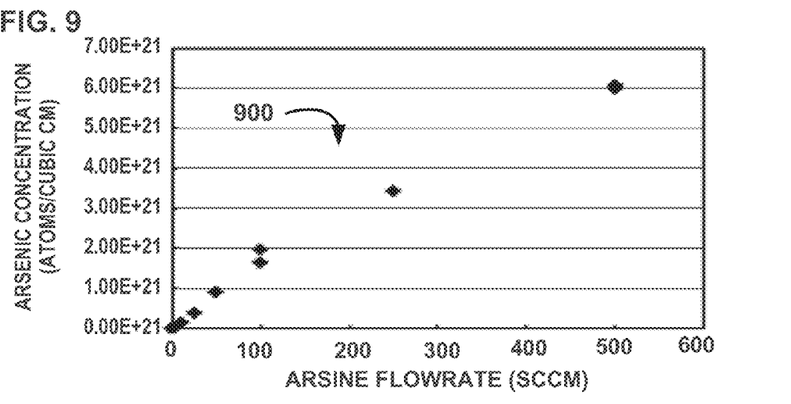
FIG. 9 illustrates a relationship between a process flow rate for an exemplary arsenic source and an arsenic concentration for silicon arsenic alloys formed according to exemplary embodiments of the present disclosure.

As yet another example, arsine flow rate, and thus reactor concentration, may be varied to adjust arsenic concentration within the silicon arsenic alloy. For example, FIG. 9 illustrates a relationship 900 between arsine flow rate and arsenic concentration for exemplary silicon arsenic alloys formed according to various embodiments of the present disclosure. Relationship 900 illustrates an approximately linear relationship between arsine flow rate and arsenic concentration within the film. It is believed that increasing the availability of arsenic during the reaction by increasing the flow rate may increase the probability that arsenic atoms may be incorporated into the lattice at given reactor conditions.

Figure 11:
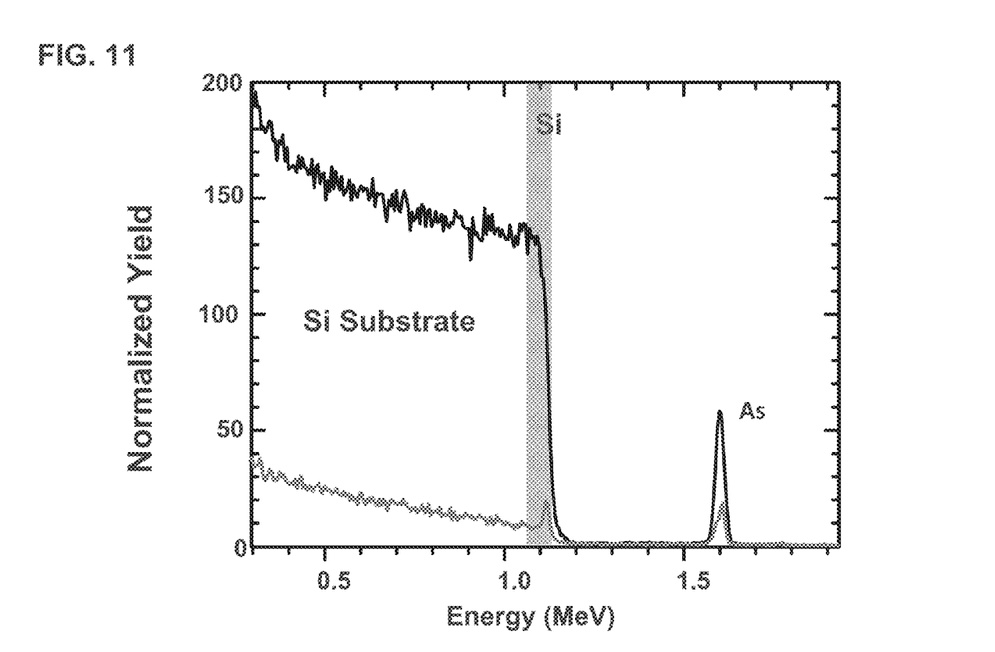
FIGS. 11-12 illustrate graphical representations of aligned and random Rutherford backscattering spectra for two example samples in accordance with exemplary embodiments of the present disclosure.
Figure 12:
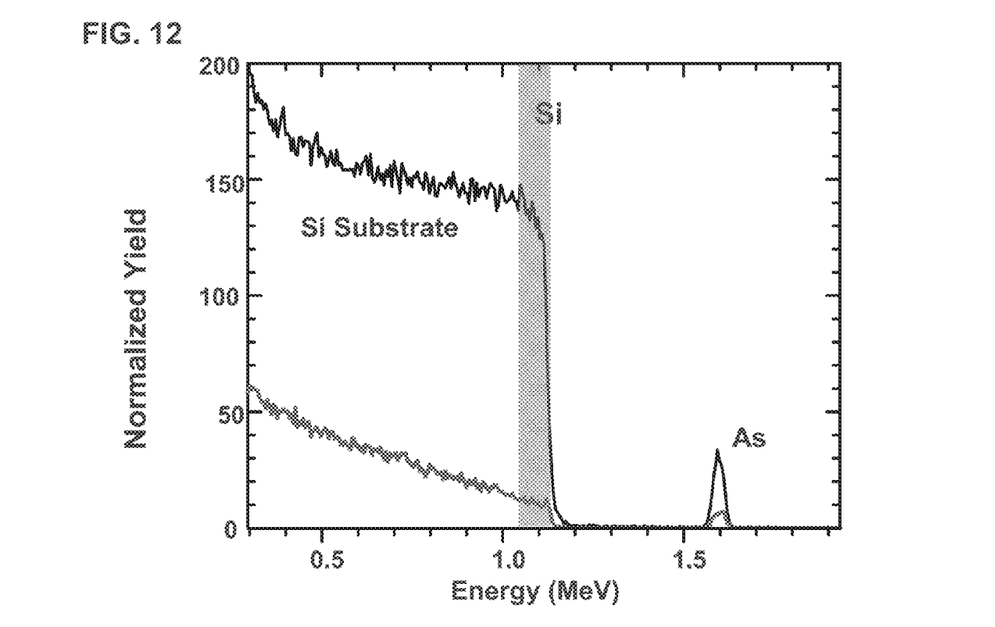

Table 1 and 2, below, are tabled of x-ray diffraction, secondary ion mass spectrometry (SIMS), and Rutherford backscattering spectrometry (RBS) data for a plurality of silicon arsenic films according to embodiments of the present disclosure. As can be seen from the x-ray diffraction data and the elemental analysis from the RBS and SIMS data, the separation ("separation degree") between the silicon and silicon arsenic alloy peaks in the x-ray diffraction pattern increases as a function of arsenic concentration in the silicon arsenic films, indicating the decrease in the lattice parameter as a function of increasing arsenic content. FIGS. 11 and 12 respectively show random (higher peaks) and aligned (lower peaks) RBS spectra for samples 1799R and 1827 of Table 1.

TABLE 1

| | SIMS | | | XRD | | |
|---|---|---|---|---|---|---|
| Run # | As at/cm^3 | Fraction | Thickness A | ⊥ lattice A | Eq Carbon at % | Thickness A |
| 1799R | 5.30E+21 | 0.11 | 433 | 5.39 | 0.98 | 501 |
| 27 | 9.56E+21 | 0.19 | 304 | 5.36 | 1.8 | 85 |
| 19 | — | — | 508 | 5.38 | 1.24 | 508 |
| 4 | 1.65E+21 | 0.03 | 1098 | 5.43 | 0.148 | 1098 |
| 9 | 3.45E+21 | 0.07 | 500 | 5.41 | 0.485 | 500 |
| 10 | 6.00E+21 | 0.12 | 903 | 5.39 | 1.03 | 903 |
| 25 | 7.33E+21 | 0.15 | 889 | 5.37 | 1.359 | 889.9 |
| 1827 | 2.00E+21 | 0.04 | 700 | 5.42 | 0.35 | 700 |

TABLE 2

| | RBS | | | | | XRD | | |
|---|---|---|---|---|---|---|---|---|
| | | | | Channeling | | | | |
| Run # | As Fraction | Si Fraction | Thickness at/cm^2 | Chi min | Quality | Substrate Degree | Layer Degree | Separation Degree |
| 1799R | 0.09 | 0.91 | 3.00E+17 | 12 | good | 34.57054 | 34.88 | 0.312 |
| 27 | 0.2 | 0.8 | 1.70E+17 | 28 | Fair | 34.56547 | 35.13 | 0.562 |
| 19 | 0.13 | 0.87 | 2.40E+17 | 24 | Fair | 34.73577 | 35.12 | 0.384 |
| 4 | 0.025 | 0.975 | 5.00E+17 | 26 | Fair | 34.60898 | 34.65 | 0.037 |
| 9 | 0.055 | 0.945 | 2.30E+17 | 23 | Fair | 34.59358 | 34.73 | 0.133 |
| 10 | 0.115 | 0.885 | 4.00E+17 | 100 | No | 34.57999 | 34.90 | 0.321 |
| 25 | 0.13 | 0.87 | 4.00E+17 | 31 | Fair | 34.75304 | 35.18 | 0.426 |
| 1827 | 0.045 | 0.955 | 3.50E+17 | 23 | Fair | 34.702 | 34.8 | 0.098 |

Figure 13:
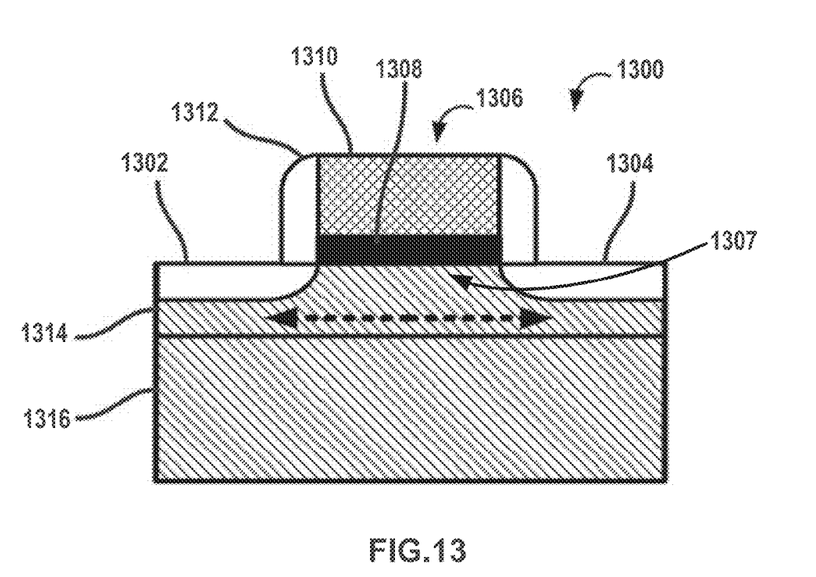
FIG. 13 illustrates an exemplary NMOS gate structure including an example tensile-stressed silicon arsenic alloy layer formed according to an exemplary embodiment of the present disclosure.

It will be appreciated that the methods described herein may be used to form one or more layers included in a semiconductor device. For example, FIG. 13 schematically illustrates a cross-section of a portion of an exemplary NMOS transistor 1300, including a source 1302, a drain 1304, and a gate 1306 that controls the flow of current in a channel region 1307 between source 1302 and drain 1304. Gate 1306 includes a gate dielectric 1308 and a gate electrode 1310. In the illustrated example, a spacer 1312 is formed on the sides of gate 1306 to mask the tips of the source and drain implants, preventing damage during contact formation.

In the example shown in FIG. 13, a silicon arsenic layer 1314 may be formed on top of a substrate layer 1316 (e.g., a silicon region including well implants). Source 1302 and drain 1304 regions may include additional doping of n- or p-type dopants. Forming the silicon arsenic alloy 1314 on top of a silicon film, other suitable film, substrate, or portions thereof, may cause silicon arsenic alloy 1314 to have a tensile stress, as indicated by the arrows shown in FIG. 13.

In accordance with additional exemplary embodiments, the silicon arsenic films are formed and the methods of forming such films described herein use a suitable semiconductor processing tool, such as cold-wall, hot-susceptor CVD reactors. An exemplary reactor system suitable for use with the present disclosure is sold by ASM under the name Intrepid™.

Figure 14:
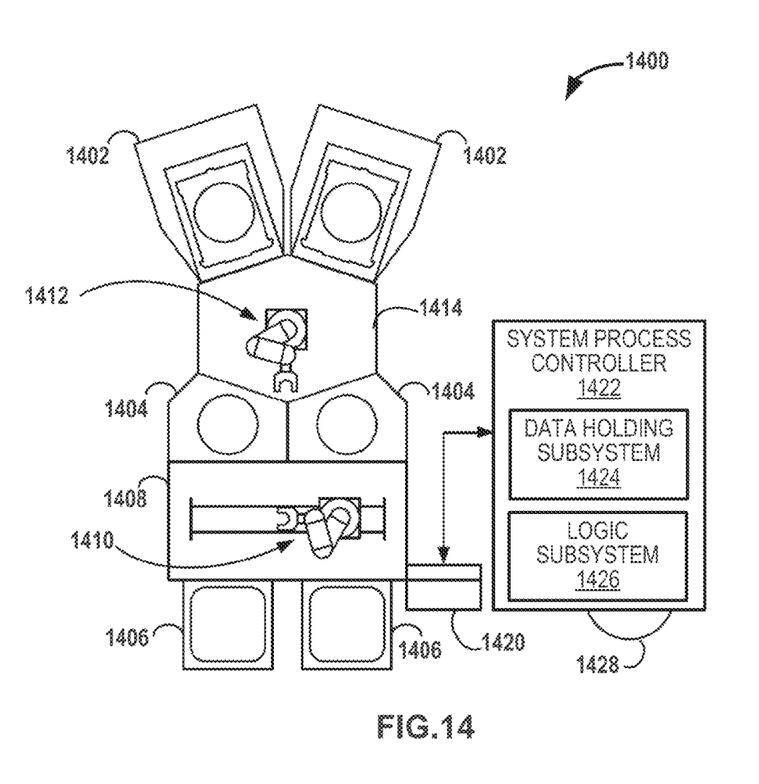
FIG. 14 illustrates an exemplary semiconductor processing tool for forming tensile-stressed silicon arsenic layers on semiconductor substrates according to exemplary embodiments of the present disclosure.

FIG. 14 schematically illustrates a top view of an exemplary semiconductor processing tool 1400, including a plurality of semiconductor processing modules 1402. While the depicted embodiment includes two modules, it will be appreciated that any suitable number of semiconductor processing modules may be provided. For example, some processing tools may include just one module while other processing tools may include more than two modules.

FIG. 14 also shows load locks 1404 for moving substrates between portions of semiconductor processing tool 1400 that exhibit ambient atmospheric pressure conditions and portions of the tool that are at pressures lower than atmospheric conditions. An atmospheric transfer module 1408, including an atmospheric substrate handling robot 1410, moves substrates between load ports 1406 and load locks 1404, where a portion of the ambient pressure is removed by a vacuum source (not shown) or is restored by backfilling with a suitable gas, depending on whether substrates are being transferred into or out of the tool. Low-pressure substrate handling robot 1412 moves substrates between load locks 1404 and semiconductor processing modules 1402 within low-pressure transfer module 1414. Substrates may also be moved among the semiconductor processing modules 1402 within low-pressure transfer module 1414 using low-pressure substrate handling robot 1412, so that sequential and/or parallel processing of substrates may be performed without exposure to air and/or without a vacuum break.

FIG. 14 also shows a user interface 1420 connected to a system process controller 1422. User interface 1420 is adapted to receive user input to system process controller 1422. User interface 1420 may optionally include a display subsystem, and suitable user input devices such as keyboards, mice, control pads, and/or touch screens, for example, that are not shown in FIG. 14.

FIG. 14 shows an embodiment of a system process controller 1422 provided for controlling semiconductor processing tool 1400. System process controller 1422 may operate process module control subsystems, such as gas control subsystems, pressure control subsystems, temperature control subsystems, electrical control subsystems, and mechanical control subsystems. Such control subsystems may receive various signals provided by sensors, relays, and controllers and make suitable adjustments in response.

System process controller 1422 comprises a computing system that includes a data-holding subsystem 1424 and a logic subsystem 1426. Data-holding subsystem 1424 may include one or more physical, non-transitory devices configured to hold data and/or instructions executable by logic subsystem 1426 to implement the methods and processes described herein. Logic subsystem 1426 may include one or more physical devices configured to execute one or more instructions stored in data-holding subsystem 1424. Logic subsystem 1426 may include one or more processors that are configured to execute software instructions.

In some embodiments, such instructions may control the execution of process recipes. Generally, a process recipe includes a sequential description of process parameters used to process a substrate, such parameters including, but not limited to, time, temperature, pressure, and concentration, as well as various parameters describing electrical, mechanical, and environmental aspects of the tool during substrate processing. The instructions may also control the execution of various maintenance recipes used during maintenance procedures.

In some embodiments, such instructions may be stored on removable computer-readable storage media 1428, which may be used to store and/or transfer data and/or instructions executable to implement the methods and processes described herein, excluding a signal per se. It will be appreciated that any suitable removable computer-readable storage media 1428 may be employed without departing from the scope of the present disclosure. Non-limiting examples include DVDs, CD-ROMs, floppy discs, and flash drives.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A structure comprising:
   a silicon layer; and
   a tensile-stressed silicon arsenic layer overlying and in physical contact with the silicon layer, the tensile-stressed silicon arsenic layer having a concentration of arsenic of greater than 5 E+20 arsenic atoms per cubic centimeter.

2. The structure of claim 1, wherein the tensile-stressed silicon arsenic layer is formed using chemical vapor deposition.

3. The structure of claim 1, wherein the tensile-stressed silicon arsenic layer is epitaxially grown overlying the silicon layer.

4. The structure of claim 1, wherein the tensile-stressed silicon arsenic layer is epitaxially grown at a pressure between about 90 Torr and about 300 Torr.

5. The structure of claim 1, wherein the tensile-stressed silicon arsenic layer is epitaxially grown at a temperature between 500° C. and 700° C.

6. The structure of claim 1, wherein the structure comprises a plurality of tensile-stressed silicon arsenic layers.

7. The structure of claim 1, wherein the tensile-stressed silicon arsenic layer does not include added carbon atoms.

8. The structure of claim 1, wherein the structure forms part of an NMOS device.

9. The structure of claim 1, wherein the structure forms part of a CMOS device.

10. The structure of claim 1, wherein the concentration of arsenic is greater than or equal to 1E+21 arsenic atoms per cubic centimeter.

11. The structure of claim 1, wherein the concentration of arsenic is about 1E+22 arsenic atoms per cubic centimeter.

12. The structure of claim 1, wherein the concentration of arsenic is about 5E+21 arsenic atoms per cubic centimeter.

13. The structure of claim 1, wherein the structure forms part of a finFET device.

14. The structure of claim 1, wherein the tensile-stressed silicon arsenic layer is a diffusion layer.

15. A semiconductor device, including:
- a silicon layer;
- a channel including a tensile-stressed silicon arsenic region overlying and in physical contact with the silicon layer, the tensile-stressed silicon arsenic region having a concentration of arsenic of greater than 5 E+20 arsenic atoms/cubic centimeter;
- a source and a drain separated from one another by the channel; and
- a gate configured to control current flow through the channel.

16. The semiconductor device of claim 15, wherein the device is a CMOS device.

17. The semiconductor device of claim 15, wherein tensile-stressed silicon arsenic region is epitaxially grown at a pressure between about 90 Torr and about 300 Torr.

18. The semiconductor device of claim 15, wherein the tensile-stressed silicon arsenic region is epitaxially grown at a temperature between 500° C. and 700° C.

19. The semiconductor device of claim 15, wherein the concentration of arsenic is about 5E+21 arsenic atoms per cubic centimeter.

20. The semiconductor device of claim 15, wherein the semiconductor device comprises a finFET device.

* * * * *